United States Patent [19]

Gibson et al.

[11] Patent Number: 4,477,308

[45] Date of Patent: Oct. 16, 1984

[54] HETEROEPITAXY OF MULTICONSTITUENT MATERIAL BY MEANS OF A TEMPLATE LAYER

[75] Inventors: John M. Gibson, Upper Montclair; John M. Poate, Summit; Raymond T. Tung, Berkeley Heights, all of N.J.

[73] Assignee: AT&T Bell Laboratories, Murray Hill, N.J.

[21] Appl. No.: 429,291

[22] Filed: Sep. 30, 1982

[51] Int. Cl.$^3$ ............................................. C30B 23/06
[52] U.S. Cl. .................................... 156/603; 156/612
[58] Field of Search ............... 156/603, 612, DIG. 64, 156/DIG. 67, DIG. 70, DIG. 73, 610, DIG. 99

[56] References Cited

U.S. PATENT DOCUMENTS 3,585,088  6/1971  Schwuttke et al. ......... 156/DIG. 80
3,928,092  12/1975  Ballamy et al. .................. 156/612 X

OTHER PUBLICATIONS

Tung et al., Growth of Single-Crystal CoSi$_2$ on Si(111), Appl. Phys. Lett. 40(8), 4/15/82, pp. 684–686.
Chiv et al., Interface and Surface Structure of Epitaxial NiSi$_2$ Films, Appl. Phys. Lett. 38(12), 6/15/81, pp. 988–990.
Bean et al., Silicon/Metal Silicide Heterostructure Grown by Molecular Bean Epitaxy, Appl. Phys. Lett. 37(7), 10/1/80, pp. 643–646.
Saitoh et al., Double Heteroepitaxy in the Si(111)-/CoSi$_2$/Si Structure, Appl. Phys. Lett. 37(2), 7/15/80, pp. 203–205.

*Primary Examiner*—Hiram H. Bernstein
*Assistant Examiner*—Michael S. Gzybowski
*Attorney, Agent, or Firm*—Eugen E. Pacher

[57] ABSTRACT

The method for growing heteroepitaxial multiconstituent material on a substrate comprises deposition of a thin disordered layer of a "template-forming" material, i.e., material containing at least one constituent of the multiconstituent material to be grown, and differing in chemical composition from at least the substrate material, on the substrate surface at a relatively low deposition temperature, raising the substrate temperature to an intermediate transformation temperature, thereby causing the template-forming material to undergo a reaction that results in formation of "template" material, typically material having substantially the same composition as the multiconstituent material to be grown. Onto the thus formed template layer is then deposited the material for the epitaxial multiconstituent layer. This general process is exemplified by the growth of NiSi$_2$ on a Si substrate, by first depositing at room temperature about 18Å of Ni (the template-forming material), onto an atomically clean and undamaged Si(111) surface, heating the substrate to about 500° C. for about 4 minutes (thereby reacting the Ni with Si from the substrate to form template material), followed by deposition, onto the now template-covered substrate, of about 250Å of Ni at a rate of about 2Å/sec, with the (template-covered) substrate maintained at about 775° C. The inventive method has wide applicability, and permits, inter alia, growth of essentially perfect epitaxial CoSi$_2$ or NiSi$_2$ on Si(100). Material grown by the method can be in form of an essentially continuous layer or a patterned layer, and can serve as the substrate for the growth thereon of further epitaxial material of different chemical composition.

22 Claims, 6 Drawing Figures

HETEROEPITAXY OF MULTICONSTITUENT MATERIAL BY MEANS OF A TEMPLATE LAYER

FIELD OF THE INVENTION

This invention pertains to the epitaxial growth of crystalline multiconstituent material on a substrate.

BACKGROUND OF THE INVENTION

Heteroepitaxy, i.e., the epitaxial growth of a layer of material on a substrate that differs in chemical composition from the epitaxial layer, has been a field of active research for some time. These efforts have led to some technologically important applications. For instance, III–V or II–VI semiconductors have been combined with ternary materials in heteroepitaxialr systems. Exemplary of this application is the system $GaAs/Al_xGa_{1-x}As$ that is widely used in optoelectronic devices. Patterned monocrystalline layers of III–V compounds have also been grown on III–V substrates (U.S. Pat. No. 3,928,092, issued Dec. 23, 1975 to W. C. Ballamy et al). Semiconductor layers are also being grown epitaxially on insulators. An example of such a heteroepitaxial system of technological importance is silicon on sapphire. Similarly, compound semiconductors, especially the III–V compounds, have been grown on sapphire substrates. For a general review, see, for instance, *Heteroepitaxial Semiconductors for Electronic Devices*, G. W. Cullen and C. C. Wang, editors, Springer-Verlag, New York (1978).

Despite the efforts of the last years, the number of heteropitaxial systems that have been developed sufficiently to permit device application is small. In particular, the number of demonstrated heteroepitaxial structures comprising an epitaxial metal layer is at present very limited. However, such systems not only are necessary for making three-dimensional integrated circuits, but would permit the realization of novel device structures, e.g., a metal-base transistor. Chief among the reported heterostructures containing an epitaxial metal layer are $CoSi_2$ on Si, and $NiSi_2$ on Si.

When $CoSi_2$ or $NiSi_2$ epitaxial films are grown on Si(111) by one of the techniques that have been employed successfully to date, e.g., by low temperature metal deposition and high temperature reaction, or by molecularbeam epitaxy, it has been found that the epitaxial material formed often contains two types of crystallites. Both types share the surface normal [111] direction with the substrate, but one has an orientation that is rotated by 180 degrees about the normal, as compared to the substrate, and the other has an orientation that is identical to that of the substrate. The former will be referred to herein as "type B", and the latter as "type A". When grains of both orientations are present in epitaxial material then the total amounts of each are often similar. The grains, of course, are separated by high-angle grain boundaries, which contribute significantly to electron scattering in the material, thus reducing the usefulness of such material as contact material in Very Large Scale Integration (VLSI) semiconductor devices. Furthermore, a silicide layer containing both A and B type crystallites is typically unsuitable to serve as substrate layer for the growth of subsequent device-quality heteroepitaxial material, e.g., a further Si layer, as would be required in the manufacture of three-dimensional integrated circuits.

Although epitaxial layers of $CoSi_2$ and $NiSi_2$ have recently been grown on Si(111), single crystal $NiSi_2$ could not be grown on Si(100), due to [111] faceting of the $NiSi_2/Si$ interface. K. C. Chiu et al, *Applied Physics Letters*, Vol. 38, pp. 988–990, (1981). Epitaxial growth of high quality single crystal metal silicide on Si(100) is, however, of great technological interest since current silicon technology uses almost exclusively (100)-oriented material.

Silicide-silicon heterostructures and a technique for preparing these structures have been disclosed by J. C. Bean et al in a U.S. patent application, Ser. No. 156,649, filed June 5, 1980. The technique disclosed therein comprises exposing a single-crystal silicon substrate to a vapor comprising a silicide-forming metal, while maintaining the substrate at an appropriate temperature at which the metal reacts, in situ, with the silicon to form a metal silicide single crystal. The heteroepitaxial silicide layers formed by this technique typically are of high perfection, as determined by Rutherford backscattering spectroscopy (RBS) and channeling, and by transmission electron microscopy.

Because of the great technological promise of heteroepitaxially grown layers of material of device quality, and because of the limited number of systems in which such growth has been achieved so far, a broadly applicable method for growing such layers if of substantial interest. In particular, a method for growing substantially perfect metal silicide on silicon is of great interest to the semiconductor industry. And furthermore, a growth technique that permits control of the orientation of the epitaxial material formed is of added technological and scientific significance.

Definitions

A "multiconstituent" material herein is a material consisting substantially of material of nominal chemical composition $A_xB_yC_z\ldots$, where A, B, ... are arbitrary chemical elements, and at least x and y are different from zero.

"Epitaxial" material is crystalline material grown on a single crystal substrate, with the epitaxial material having at least one crystallographic axis in common with the substrate.

A "heteroepitaxial" material is an epitaxial material, with the concentration of at least one chemical element being substantially different in the substrate material from that in the epitaxial material.

A "template layer" is a thin layer of material formed on a substrate for the purpose of influencing the crystallography of material, typically multiconstituent material, epitaxially grown thereon. The chemical composition of the template layer is typically substantially the same as that of the epitaxial material to be grown thereon.

"Template-forming" (T-F) material is material deposited on the substrate in substantially disordered form, which can undergo a transformation to form the template layer. The transformation typically comprises a transformation from the disordered to the crystalline state, and can further comprise a reaction with a chemical element whose concentration in the T-F material is substantially different from its concentration in the substrate. T-F material typically comprises at least one of the chemical constituents of the epitaxial material to be grown thereon, and differs in chemical composition from the substrate material.

By "transport element" we mean an element that is present in greater than trace amounts in both the substrate material and the heteroepitaxial multiconstituent material formed thereon, and that can react with T-F material to form, under appropriate reaction conditions, template material.

SUMMARY OF THE INVENTION

We are describing herein a method for producing a heterostructure comprising an epitaxial multiconstituent material on a substrate. The method comprises depositing, substantially spatially uniformly, a thin layer of T-F material, typically less than about 100 Å thick, onto the substantially atomically clean substrate, or onto part thereof, with the substrate at a relatively low deposition temperature, resulting typically in a substantially disordered deposit. The method further comprises raising the temperature of the substrate, with the thin layer of T-F material deposited thereon, to an appropriate transformation temperature at which the deposited material undergoes a transformation, typically forming ordered, epitaxial material. Onto this transformed material, referred to herein generally as the "template" layer, is then deposited material for growing the epitaxial layer, with epitaxial crystal growth taking place if the substrate is maintained at an appropriate, typically higher, growth temperature, and with the crystallography of the epitaxial layer being controlled by the template layer.

The inventive method for heteroepitaxial formation of multiconstituent materials is considered to be of broad applicability. In particular, it is considered to apply to the growth of multiconstituent epitaxial material, either in unpatterned or patterned layer form, on multiconstituent substrates as well as on monoconstituent substrates. Exemplary of systems considered suitable for application of the inventive method are epitaxial metallic or insulating layers on Si, Ge, III-V and II-VI semiconductors. Preferred systems are the metal silicides and germinates on Si and Ge, respectively, including silicides of other than (111) orientation, e.g., $CoSi_2$ or $NiSi_2$ of (100) orientation on (100) Si substrates. Obvious variations of the method, e.g., growth on the template layer of epitaxial material differing in chemical composition from the template layer, are also contemplated.

The inventive method typically permits use of lower epitaxial growth temperatures and of shorter growth times than prior art reaction methods. This is of obvious commercial interest. Furthermore, the method permits growth of truly monocrystalline material, e.g., $NiSi_2$, results in substantially smooth interfaces in systems subject to faceting by prior art methods, e.g., (100) $NiSi_2$, and typically yields pinhole-free material of device-grade quality.

DETAILED DESCRIPTION

An important aspect of the inventive method is the formation of a thin template layer. This is accomplished by depositing an appropriate thickness of T-F material on the substrate, and transforming the T-F material, in a subsequent transformation which can comprise a reaction with one or more transport elements, into the template layer.

The T-F material is deposited while the substrate is at an appropriate low deposition temperature, e.g., at room temperature. As a consequence of this low-temperature deposition, the (as-deposited) T-F material is typically in a disordered state.

Subsequent to the deposition of the T-F material the substrate temperature is raised to an appropriate transformation temperature, typically lower than the growth temperature of the epitaxial material to be grown, at which the deposited material undergoes a transformation to form the template layer. The transformation typically comprises an ordering transformation which results in appearance of long range order in previously disordered material, and may comprise a reaction in which the T-F material and one or more transport elements derived from the substrate react to form template material. An example of the former is the formation of single crystal $NiSi_2$ template material from co-deposited disordered stoichiometric Ni and Si, and an example of the latter is the formation of such template material from Ni deposited onto a Si substrate.

Figure 1:
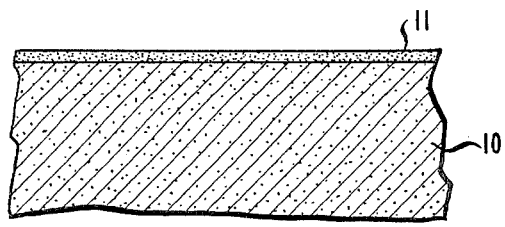
FIG. 1 schematically depicts a thin layer of asdeposited material on a substrate.
Figure 2:
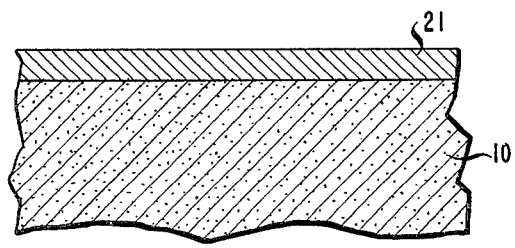
FIG. 2 schematically shows the substrate with a template layer formed thereon.

Formation of a template layer is schematically shown in FIGS. 1 and 2. FIG. 1 shows a layer 11 of T-F material on substrate 10, and FIG. 2 shows template layer 21, formed by a T-F transformation at the transformation temperature, on substrate 10.

A further aspect of the invention is the possibility of controlling, in appropriate heteroepitaxial systems, the crystalline orientation of the epitaxial layer through control of some parameter, typically the thickness, of the template layer. In such systems it is typically necessary to closely control the thickness of the deposited T-F material, taking account of the fact that reaction of the T-F material with the transport element (or elements) typically produces material of different specific density than the starting deposit.

After formation of the template layer on the original substrate, sufficient amounts of at least some of the constituents of the epitaxial material are to be deposited thereon, and epitaxial material of the appropriate chemical composition and crystalline orientation and perfection grown under appropriately chosen conditions. This entails maintaining the substrate at an appropriate growth temperature that is typically higher than the T-F transformation temperature for a period of time during and/or after deposition. Furthermore, it may impose limits on the deposition rate, as well as on the chemical composition of the deposits. In this step of the inventive process, for instance, all of the chemical constituents of the epitaxial material can be deposited substantially simultaneously and in the appropriate stoichiometric ratio, or one or more of the chemical constituents of the epitaxial material may be substantially absent from the flux, to be derived from the substrate material. Furthermore, the constituents can be deposited in a one-step or in a multistep procedure. The former refers to procedures in which the epitaxial layer is grown to final thickness in a substantially continuous manner, and the latter to procedures in which the layer is built up to final thickness in a sequence of deposition/growth steps.

Figure 3:
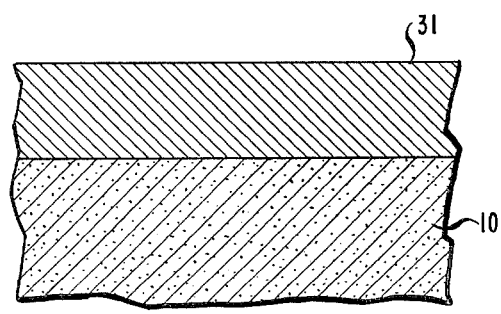
FIG. 3 schematically shows the substrate with an epitaxial layer grown thereon.

FIG. 3 schematically depicts heteroepitaxial layer 31 grown on substrate 10 by the inventive process. It is to be noted that typically the template layer cannot be separately identified at this stage (or at later stages) of the heterostructure-producing process, since the template material typically becomes part of the epitaxial material. However, this is not necessarily the case, and we also contemplate practice of the inventive process resulting in epitaxial material grown on a later identifiable template layer.

Figure 4:
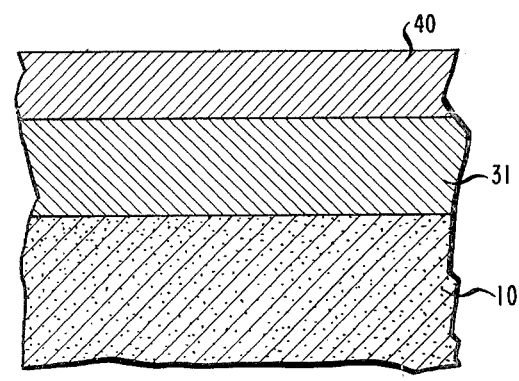
FIG. 4 schematically depicts a heteroepitaxial structure comprising a substrate, an epitaxial layer grown thereon, and a further epitaxial layer grown on the first epitaxial layer, FIG. 5 schematically shows patterned epitaxial material on a masked substrate.

FIG. 4 schematically shows a double-heterostructure, namely a first epitaxial layer 31, e.g., a metal silicide layer grown by the inventive process on substrate 10, and a second epitaxial layer 40, e.g., a silicon layer, grown on layer 31. Such a double-heterostructure is illustrative of structures grown by means of the inventive process that are useful, inter alia, in three dimensional semiconductor devices, e.g., metalbase transistors. Growth of layer 40 is typically by conventional epitaxy methods.

Figure 5:
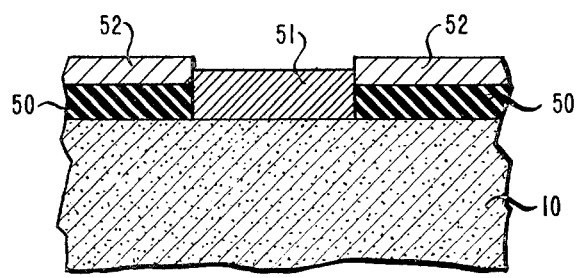

FIG. 5 illustrates schematically patterned multiconstituent epitaxial material on a substrate as produced by the inventive method. On substrate 10 a patterned masking layer 50 is formed, e.g., a $SiO_2$ layer, formed and patterned by conventional techniques on Si. Onto the thus masked substrate T-F material is depositked, for instance, about 18 Å of Ni. By heating the composite to an appropriate transformation temperature, a template layer is formed in the bared substrate regions, e.g., by reaction with the substrate material. Onto the substrate is then deposited further material, e.g., Ni, from which epitaxial material 51 is formed in the previously bare regions of the substrate, e.g., single crystal $NiSi_2$, whereas the material deposited onto the masking material (52) does not form epitaxial material, e.g., remains Ni. Typically there exist etches in which material 51 etches slower than material 52, therefore it is possible to remove the latter without removing all of the former, resulting in patterned heteroepitaxial material on a partially masked substrate.

An important aspect of this invention is a requirement for a high degree of cleanliness throughout the practice of the inventive process. This typically implies operation under UHV conditions, typically vacuum pressures lower than about $10^{-8}$ Torr, and substrate surface preparation, e.g., sputtering or heat treatment, that results in removal of contaminants.

Any deposition method, for either the T-F material or the epitaxial-layer-forming material, that is compatible with the above-indicated cleanliness requirement is potentially useful in the practice of the invention. Such methods include evaporation, molecular beam epitaxy, and sputtering.

As has been mentioned above, single crystal epitaxial metal silicides on silicon are of considerable interest for semiconductor device applications. The inventive method can advantageously be applied to the growth of these heterostructures, especially to the growth of structures comprising $CoSi_2$ on Si or $NiSi_2$ on Si, and growth of metal silicides on silicon is a preferred application of the inventive method. We will now discuss this application.

In order for the inventive method to yield high quality epitaxial single crystal metal silicide, the Si substrate surface has to be atomically clean, and be substantially damage free, prior to deposition thereon of T-F material.

Onto the substrate surface the T-F material, e.g., Co or Ni, with or without Si, is deposited by any appropriate technique, e.g., by MBE or by evaporation. The deposition rate is typically between about 0.1 Å/sec and about 10 Å/sec and during deposition the substrate is to be maintained at a relatively low temperature, typically at less than about 200° C., preferably less than about 100° C. As a conseqence of the low deposition temperature, the T-F material is in a disordered state, i.e., a state such that no long-range order is detectable by, e.g., LEED.

The thickness of the layer of T-F material deposited determines the thickness of the template layer formed therefrom, and the thickness of the template layer can have an effect on the growth of epitaxial material thereon. For instance, we have found that the thickness of the T-F nickel layer can determine the orientation of the epitaxial $NiSi_2$ grown on the template layer formed from the deposited Ni by means of a reaction on a Si(111) substrate. This is exemplified by FIG. 6, which presents the experimentally determined relationship between the average thickness of the (as-deposited) T-F nickel layer and the percentage of $NiSi_2$ with A-orientation in a 1000 Å thick layer of epitaxial $NiSi_2$ grown thereon, as it exists under a typical set of experimental conditions used by us.

Figure 6:
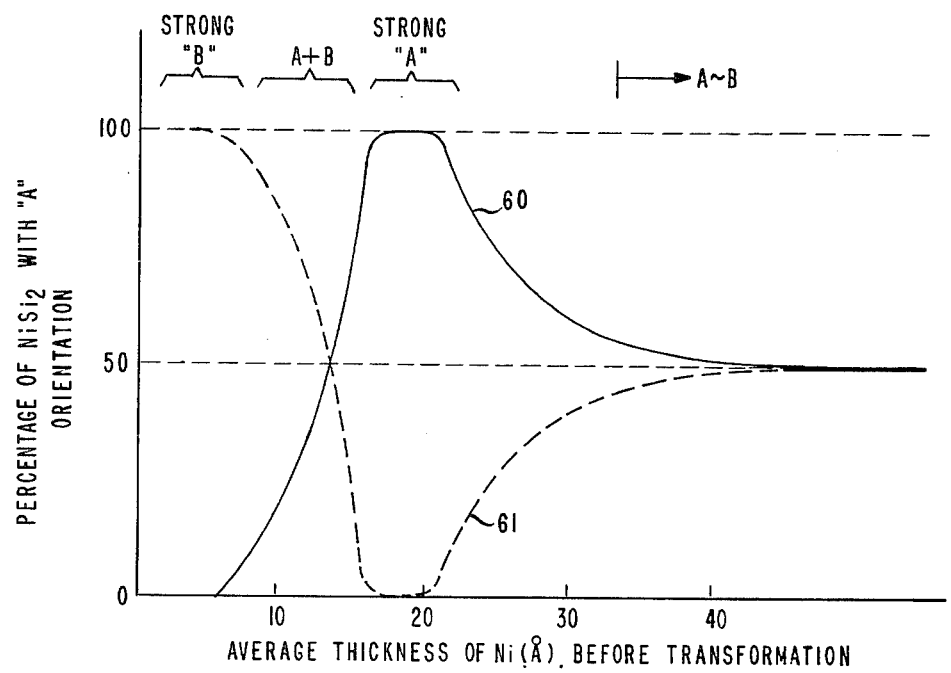
FIG. 6 shows experimentally determined relationships between the thickness of a nickel layer deposited onto a Si (111) substrate and the orientation of the epitaxial $NiSi_2$ grown on the template layer formed therefrom.

As can be seen from curve 60 of FIG. 6, there exists a thickness regime in which growth of B-type epitaxial material is strongly favored (Ni average thickness less than about 7 Å), a regime in which the epitaxial material is a mixture of A-type and B-type crystallites (Ni average thickness between about 7 Å and about 15 Å), a regime in which the growth of A-type epitaxial material is strongly favored (Ni average thickness between about 15 Å and about 21 Å), and finally a further regime in which the epitaxial material is a mixture of A-type and B-type crystallites. Since the epitaxial material contained only A- and/or B-type material, curve 61, which shows the percentage of B-type $NiSi_2$, is the mirror image about the 50 percent line of curve 60.

Subsequent to the low temperature deposition of the T-F material, a layer of template material is formed by raising the substrate temperature to the appropriate transformation temperature. The transformation temperature depends, inter alia, on the chemical composition of the epitaxial material to be formed. For instance, for $NiSi_2$ on Si(111), we have found that transformation temperatures between about 400 degrees C and about 600 degrees C typically yield template material according to the invention, and for $CoSi_2$ on Si(111) this is the case for transformation temperatures between about 400° C. and about 700° C. It is generally advantageous to raise the temperature relatively rapidly to the transformation temperature. For instance, in $NiSi_2$ on Si(111), we have found that raising the temperature in about 15 seconds from room temperature to the transformation temperature produces better quality epitaxial material than raising it in about 5 minutes. The time at the transformation temperature required for substantial completion of the transformation is generally short, typically less than about 5 minutes. LEED observation of transformed material, i.e., template material, typically shows patterns characteristic of crystalline material.

The T-F material in metal silicide/Si systems advantageously consists essentially of the metal. For instance, in the $CoSi_2$/Si and $NiSi_2$/Si systems, the preferred T-F materials are Co and Ni, respectively. In these systems, the transport element is Si. At the transformation temperature, Si from the substrate reacts chemically with the T-F metal to form ordered epitaxial template material that typically has a chemical composition similar to that of the epitaxial material to be grown thereon.

The template layer formed by reacting a layer of T-F metal with Si is typically of different thickness than the original layer of T-F metal. For instance, Ni of average thickness x forms, after reacting with Si, $NiSi_2$ of about 3.65 x average thickness.

Following the formation of the template layer by heating of the substrate with T-F metal deposited thereon, the growth of epitaxial silicide on the composite substrate formed by the template-covered original Si substrate can be accomplished by any appropriate technique, typically at temperatures above about 600° C. It requires deposition of an appropriate amount of metal, or metal and Si, on the composite substrate. Exemplary deposition methods are evaporation, MBE, and sputtering. The overall chemical composition of the deposit can be either substantially that of the epitaxial silicide to be formed (e.g., by co-deposition of metal and Si), or it can contain a substantially lower concentration of Si (e.g., by deposition of metal only).

A variety of deposition and growth procedures can be employed in this step of the inventive method. For instance, the material can be deposited while maintaining the composite substrate at a temperature at which epitaxial growth does occur. This is exemplified by the growth of $NiSi_2$ on Si(111) by deposition, typically at a rate between about 0.1 and 10 Å/sec, of Ni onto the composite substrate maintaned at a temperature between 700° and 850° C.

A different possible deposition and growth procedure comprises co-depositing metal and Si in approximately stoichiometric proportion, with the composite substrate being maintained at an appropriate elevated temperature and the deposition rates adjusted such that epitaxial growth can occur simultaneously with material deposition. For instance, epitaxial $CoSi_2$ films can be grown by co-depositing Si and Co in approximately 2:1 atomic ratio on the surface of a composite Si(111) substrate according to the invention, i.e., a template-covered Si(111) substrate, maintained at about 600°–650° C.

Very thin templates, e.g., those that favor formation of B-type $NiSi_2$, advantageously are kept a minimum of time at temperatures substantially higher than the highest transformation temperatures for the system in question. For instance, templates formed by depositing less than about 7 Å Ni onto Si(111) are best not kept at temperatures above about 650° C. for periods longer than a few minutes. Such templates can, however, be "stabilized" by appropriately increasing the thickness of the transformed layer subsequent to the T-F transformation. In the Si(111)/$NiSi_2$ system, this can, for instance, be done by deposition of Ni (e.g., 20 Å thick) at about 650° C., or by a multiplicity of low temperature Ni deposition/transformation cycles.

Other deposition and growth procedures for epitaxial material that can be employed in the practice of the inventive method are either well known to those skilled in the art or can be readily devised by them, and we consider the scope of the invention not to depend on the method or procedure used for growing the epitaxial material on a composite substrate according to the invention.

Example I: A Si(111) substrate was degreased and dipped in HF, then placed into a vacuum chamber. After UHV conditions were reached (base pressure about $10^{-10}$ Torr), the substrate was sputtered by 1.5 KeV argon and annealed to about 850° C. Just prior to deposition of T-F metal the substrate was heated to about 1100° C. for about 2 minutes and allowed to cool down slowly. The surface produced the sharp 7×7 LEED pattern that is characteristic of a clean Si(111) surface, and contained no impurities except a negligible amount of carbon. A Ni layer of about 18 Å average thickness was deposited on the clean substrate surface maintained at room temperature (by electron gun evaporation at a rate of about 1 Å/s), followed by rapidly heating the substrate to the transformation temperature of about 500° C. and maintaining it at that temperature for about 4 minutes. After raising the substrate temperature to about 775° C. and maintaining it there, about 250 Å of Ni was deposited by e-gun evaporation, at a rate of about 2 Å/sec. This resulted in concurrent growth of a layer of $NiSi_2$, of about 1000 Å thickness, consisting exclusively of A-type single crystalline material, as determined by RBS and TEM, with conventionally determined channeling $\chi_{min}$ less than about 3%.

Example II: After preparing a Si(100) substrate substantially as described in Example I, a Ni layer of about 10 Å average thickness was deposited thereon at about 1 Å/sec, with the substrate approximately at room temperature. After rapidly raising the substrate temperature to about 550° C. for about 4 min. and further raising the temperature to about 650° C., 200 Å of Ni were deposited. The resulting, about 800 Å thick, (100) oriented single crystalline $NiSi_2$ layer was continuous and had $\chi_{min}$ less than 5%. Moreover, the Si/$NiSi_2$ interface was found to be flat within the resolution of RBS. This is to be contrasted with analogous prior art (100) films which have grossly faceted interfaces, and typically $\chi_{min}$ of no less than about 12%.

Example III: A Si(100) substrate is prepared substantially as described above, a Co layer of about 5 Å average thickness is deposited at about 1 Å/sec, while the substrate is at about room temperature. Then the substrate temperature is raised to about 600° C. for about 4 minutes, followed by deposition of 200 Å of Co at about 700° C., at a rate of about 0.2 Å/sec, resulting in formation of a single crystal epitaxial $CoSi_2$ film of about 740 Å thickness.

Example IV: On a Si(111) surface a 0.3 μm thick $SiO_2$ layer is grown by thermal oxidation. After etching windows through the layer by standard photolithography and plasma etch techniques, and heating, in UHV, the masked substrate to about 900° C. for about 10 minutes to remove native oxide from the window regions of the substrate, a patterned layer of epitaxial single crystal $NiSi_2$ is formed in the window regions by a technique substantially as described in Example I. After epitaxial growth of the material by reaction with Si from the substrate, a layer of Ni remains on the $SiO_2$. This is removed by chemical etching in 150 parts $CH_3COOH$, 50 parts $HNO_3$ and 3 parts HCl at 50° C.

Example V: Patterned (100) $NiSi_2$ is formed on a Si(100) surface by a procedure substantially as described in Example IV.

Example VI: Patterned (100) NiSi$_2$ is formed as in Example V, followed by growth thereon of epitaxial (100)-oriented single crystal Si by conventional MBE deposition of Si at a rate of about 5 Å/sec, at a substrate temperature of about 500° C.

What is claimed is:

1. A method for producing a heterostructure comprising epitaxial multiconstituent first material on a substrate comprising a second material, with the second material differing in chemical composition from the first material, the method comprising:
   (a) growing on at least a part of the substrate, at a growth temperature, epitaxial first material comprising material deposited on the substrate,
   Characterized in that the methd further comprises:
   (b) depositing, prior to (a), substantially spatially uniformly on at least the part of the substrate, an effective amount of matter, to be referred to as template-forming material, the template-forming material comprising at least one of the chemical constituents of the first material and differing in chemical composition from at least the second material, the substrate being during deposition of the template-forming material at a deposition temperature that is substantially lower than a transformation temperature, whereby the template-forming material deposit is in substantially disordered form, and
   (c) raising, subsequent to (b) but still prior to (a), the temperature of the substrate with the template-forming material thereon to a transformation temperature, the transformation temperature being lower than the growth temperature, whereby a template material is formed on the substrate, the thus produced composite forming the substrate referred to in (a).

2. The method of claim 1, wherein at least part of the substrate is covered by a patterned masking layer.

3. The method of claim 1, wherein the average thickness of the template-forming material is less than about 100 Å.

4. The method of claim 1, wherein the second material consists of a material selected from the group consisting of silicon, germanium, the III-V semiconductors, and the II-VI semiconductors.

5. The method of claim 4, wherein the first material consists of a material selected from the group consisting substantially of multiconstituent metallic materials and multiconstituent insulating materials.

6. The method of claim 5, wherein the second material consists essentially of material selected from the group consisting of silicon and germanium, and the first material consists substantially of a material selected from the group consisting of the metal silicides and the metal germanates.

7. The method of claim 6, wherein the second material consists essentially of silicon, and the first material of a metal silicide.

8. The method of claim 7, wherein the crystallographic orientation of the substrate substantially is a (111) or a (100) orientation.

9. The method of claim 7, wherein the material deposited in step (a) contains the constituents of the first material in substantially the same proportions as the first material.

10. The method of claim 9, wherein the material in step (a) is deposited by co-deposition.

11. The method of claim 10, wherein the material deposited in step (a) contains silicon and a material selected from the group consisting of Co and Ni, in substantially 2:1 atomic proportions.

12. The method of claim 7, wherein the material deposited in step (a) does not contain Si in an effective amount for forming the layer of first material.

13. The method of claim 12, wherein formation of the first material comprises a chemical reaction with Si derived from the substrate.

14. The method of claim 13, wherein the material deposited in step (a) is selected from the group consisting of Co and Ni.

15. The method of claim 14, wherein step (a) is carried out more than once.

16. The method of claim 7, wherein the template-forming material consists substantially of a metal.

17. The method of claim 16, wherein the first material consists substantially of a material selected from the group consisting of CoSi$_2$ and NiSi$_2$.

18. The method of claim 17, wherein the deposition temperature is less than about 200° C.

19. The method of claim 17, wherein the transformation temperature is between about 400° C. and about 700° C.

20. The method of claim 17, wherein the growth temperature is greater than about 600° C.

21. The method of claim 17, wherein the effective thickness of the template-forming material is less than about 21 Å.

22. A method for producing a heterostructure comprising epitaxial first material on an epitaxial substrate layer overlying a monocrystalline second material substrate, with the substrate layer material differing in chemical composition from the first material and the second material, the method comprising:
   (a) growing, on at least a part of the substrate layer, at a growth temperature, epitaxial first material comprising material deposited on the substrate layer, characterized in that the method further comprises
   (b) depositing, prior to (a), substantially spatially uniformly on at least part of the monocrystalline second material substrate, a layer of material no more than about 100Å thick, the material to be referred to as template-forming material, the template-forming material differing in chemical composition from at least the second material, the second material substrate being during deposition of the template-forming material at a deposition temperature that is substantially lower than a transformation temperature, whereby the template-forming material deposit is in substantially disordered form, and
   (c) raising, subsequent to (b), but still prior to (a), the temperature of the second material substrate with the template-forming material thereon to a transformation temperature, whereby the epitaxial substrate layer is formed on the second material substrate.

* * * * *